US010527684B2

(12) United States Patent
Baudet et al.

(10) Patent No.: US 10,527,684 B2
(45) Date of Patent: Jan. 7, 2020

(54) PENDULUM SYSTEM

(71) Applicant: SAFRAN ELECTRONICS & DEFENSE, Boulogne Billancourt (FR)

(72) Inventors: Yannick Baudet, Boulogne Billancourt (FR); Etienne Merlet, Boulogne Billancourt (FR); Fabrice Jean, Boulogne Billancourt (FR); Laurent Desroches, Boulogne Billancourt (FR); Mickaël Magalhaes, Boulogne Billancourt (FR)

(73) Assignee: SAFRAN ELECTRONICS & DEFENSE, Boulogne Billancourt (FR)

( * ) Notice: Subject to any disclaimer, the term of this patent is extended or adjusted under 35 U.S.C. 154(b) by 0 days.

(21) Appl. No.: 16/333,882

(22) PCT Filed: Aug. 22, 2017

(86) PCT No.: PCT/EP2017/071164
§ 371 (c)(1),
(2) Date: Mar. 15, 2019

(87) PCT Pub. No.: WO2018/054637
PCT Pub. Date: Mar. 29, 2018

(65) Prior Publication Data
US 2019/0204394 A1 Jul. 4, 2019

(30) Foreign Application Priority Data
Sep. 20, 2016 (FR) ...................................... 16 58800

(51) Int. Cl.
G01R 33/00 (2006.01)
G01R 33/04 (2006.01)

(52) U.S. Cl.
CPC ......... G01R 33/0047 (2013.01); G01R 33/00 (2013.01); G01R 33/04 (2013.01)

(58) Field of Classification Search
None
See application file for complete search history.

(56) References Cited

U.S. PATENT DOCUMENTS 3,873,914 A    3/1975  Kesselring
5,835,996 A *  11/1998 Hashimoto ............ G04C 10/00
                                                    323/364

FOREIGN PATENT DOCUMENTS

FR    2 238 162 A1   2/1975
FR    2 974 420 A1   10/2012

* cited by examiner

Primary Examiner — Douglas X Rodriguez
(74) Attorney, Agent, or Firm — Muncy, Geissler, Olds & Lowe, P.C.

(57) ABSTRACT

The invention provides a pendulum system including a pendulum connected to a connector, the system including wires connecting the pendulum to the connector, which wires are connected together in a twisted cable, the twisted cable presenting a spiral central portion generally shaped as a cone having its apex connected to the connector so as to be the portion of the spiral that is closest to the pivot point of the pendulum. The invention also provides a method of fabricating such a pendulum system.

12 Claims, 1 Drawing Sheet

PENDULUM SYSTEM

The present invention relates to a pendulum system, such as for example, and in non-lilting manner, a magnetometer device, and more particularly a fluxgate.

The invention also provides a method of fabricating such a gate.

TECHNOLOGICAL BACKGROUND OF THE INVENTION

A fluxgate is a device for measuring the Earth's magnetic field and that serves to determine the orientation of the Earth's magnetic field relative to a reference axis.

When the fluxgate is mounted on an aircraft, the reference axis is aligned with the travel axis of the aircraft so that the fluxgate serves to determine the magnetic heading of the aircraft.

A fluxgate comprises two single-axis magnetometers arranged perpendicularly relative to each other in a plane that is substantially horizontal.

Each magnetometer has a core of high magnetic permeability material selected in such a manner that the Earth's magnetic field suffices to bring the core to a state close to its saturated state. The cores are surrounded by a primary winding and by a secondary winding. The primary winding is fed with alternating current (AC) so as to generate variation within the core in the magnetic field, thereby producing a potential difference across the terminals of the secondary winding. The signal that appears on the secondary winding can be processed in order to determine very accurately the components of the magnetic field in the directions of the coils concerned.

In order to subtract the vertical component of the Earth's magnetic field from the magnetometers, it is necessary to keep the magnetometers in a plane that is as horizontal as possible. For this purpose, the cores are mounted on a pendulum suspended under a plate. The windings of the magnetometers are then connected by wires to a connector that is mounted at the center of the plate.

In order to protect said wires, in particular during large swings of the pendulum, it is known to bring the wires together in order to form a twisted cable going up from the pendulum to the connector, however that nevertheless makes it necessary to have a fluxgate that is relatively heavy in order to obtain good robustness for the electrical connection without interaction on the equilibrium of the pendulum, with the fluxgate also being bulky.

OBJECT OF THE INVENTION

An object of the invention is to provide means making it possible to have a pendulum system of reduced mass and of reduced size.

BRIEF SUMMARY OF THE INVENTION

To this end, the invention provides a pendulum system comprising a pendulum connected to a connector, the system comprising wires connecting the pendulum to the connector, which wires are connected together in a twisted cable, the twisted cable presenting a spiral central portion generally shaped as a cone having an apex connected to the connector so as to be the portion of the spiral that is closest to a pivot point of the pendulum.

Because of the conical spiral shape of the twisted cable, it is thus possible to have a pendulum system that presents relatively little mass and that is relatively compact, while reducing the height occupied by the twisted cable, which may itself be of considerable length, without any risk of interference between the turns of the cone, even when the pendulum swings through a large angle.

In advantageous manner, this also makes it possible to ensure a flexible and long-lasting connection between the connector and the pendulum, while avoiding in particular any breakage of one of the wires or any offset in the equilibrium position of the pendulum.

In a particular embodiment of the invention, the spiral presents a structure that is uniform when the pendulum is at rest.

In a particular embodiment of the invention, the conical spiral does not present any change of angle along its length.

In a particular embodiment of the invention, the spiral presents an integer number of turns.

In a particular embodiment of the invention, the twisted cable is itself shaped so as to present a structure that is uniform.

In a particular embodiment of the invention, the number of twists of the twisted cable is uniform over the entire length of the twisted cable.

In a particular embodiment of the invention, the twisted cable is shaped so that the number of twists in the twisted cable is an integer number.

In a particular embodiment of the invention, the twisted cable has an end portion embedded in a block that is secured to the connector.

In a particular embodiment of the invention, the free end portion of the twisted cable secured to the connector is arranged substantially at the pivot point of the pendulum.

In a particular embodiment of the invention, the pendulum system includes a block secured to the connector and holding captive a zone where the wires are connected to the pins of the connector.

In a particular embodiment of the invention, the spiral has an end portion secured to the pendulum in such a manner that the end of the spiral is substantially tangential to a plane formed by the base of the pendulum.

In a particular embodiment of the invention, the twisted cable is secured to the pendulum at two points.

The invention also provides a method of fabricating a pendulum system as mentioned above, the method comprising the steps of:

- securing each of the connection wires to one end of the connector so as to constitute a bundle of same-length wires;
- shaping the central portion of the bundle of wires into a twisted cable that is uniform over its entire length;
- securing the end of the twisted cable to the connector so as to ensure that there is no non-twisted free wire portion at that end;
- shaping the central portion of the twisted cable into a conical spiral; and
- securing the base of the spiral to the pendulum, and ensuring that the apex does not form a right angle with the remainder of the spiral.

Other characteristics and advantages of the invention appear on reading the following description of a particular, non-limiting embodiment of the invention.

BRIEF DESCRIPTION OF THE FIGURES

Reference is made to the accompanying drawing, in which.

DETAILED DESCRIPTION OF THE INVENTION

Figure 1:
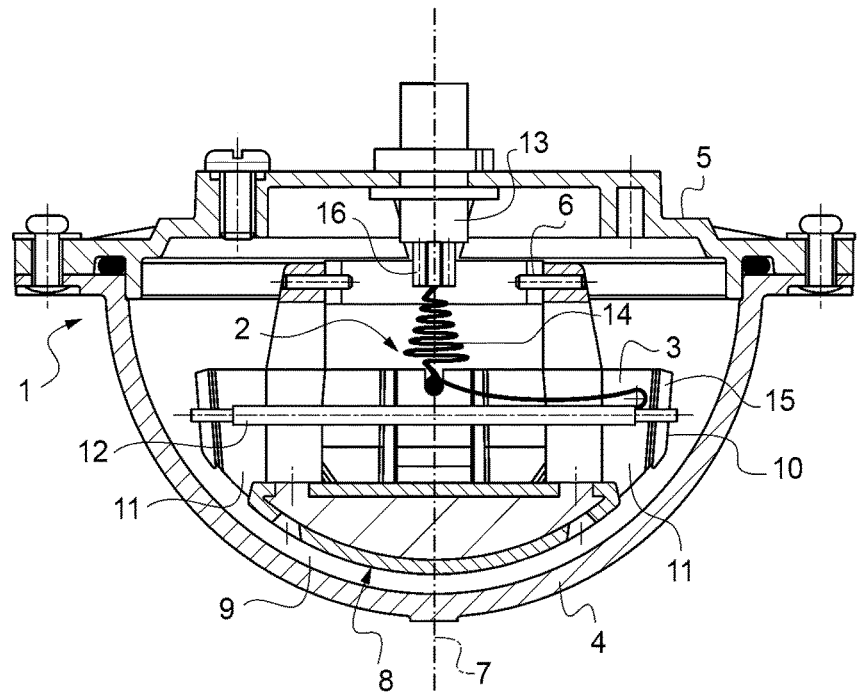
FIG. 1 is an axial section view of a pendulum system in a particular embodiment of the invention.

With reference to FIG. 1, the pendulum system in a particular embodiment of the invention is constituted in this example by a fluxgate. This application is naturally not limiting and the pendulum system could for example be some other magnetometer device.

The fluxgate typically comprises a housing given overall reference 1, containing an electromagnetic unit 2 for detecting magnetic field and a pendulum 3, which is suspended inside the housing and which supports the electromagnetic unit 2.

The housing 1 has a wall 4 in the form of a spherical cap that allows the pendulum 3 to move, and that has a circular edge defining an opening that is closed by a plate 5 for fastening the gate to a support.

The pendulum 3 is suspended from the plate 5 by a double hinge 6 comprising a ring connected to the plate 5 to pivot about a first axis, and connected to the pendulum 3 to pivot about a second axis perpendicular to the first axis and coplanar therewith. The means for connecting the ring to the plate 5 comprise two short pivot connections and the means connecting the ring to the pendulum 3 likewise comprise two short pivot connections. For each axis, each pivot connection comprises a trunion having a knurled end embedded in the pendulum or in the plate and an opposite end that is freely received via a sliding fit in a hole made in the ring. The embedding of the knurled portion may be reinforced by adhesive. The journal of the fit is as small as possible to avoid any deformation of the part that leads to misalignment of the trunions giving rise to stresses prejudicial to movement of the pendulum. In a variant, the pivot connections may be replaced by ball connections to further limit any stresses that might result from poor alignment of the trunions, even though this variant is nevertheless more expensive. The double hinge 6 allows the pendulum 5 to swing through about 30° on either side of a third axis normal to the plate and intersecting the first and second axes.

The pendulum 3 incorporates a balanced mass so that when at rest, with the plate horizontal, an axis 7 passing through the center of gravity of the pendulum and the intersection between the pivot axes of the pendulum 3 is normal to the plate 5 (i.e. the pivot point of the pendulum 3).

The pendulum 3 has a surface 8 in the form of a spherical cap centered on the axis 7 facing the wall 4. The surface 8 co-operates with the wall 4 to define a throttling space 9. The surface 8 is surrounded by an annular surface portion 10 that is set back and that is pierced by through openings 11 in the vicinity of its periphery.

Preferably, the pendulum is made of thermoplastic material, in this example without a filler in order to enhance the accuracy and the geometrical stability with temperature of the spherical surfaces, and it incorporates an insert, e.g. made of metal, forming an inertial mass. Under such circumstances, the pendulum is advantageously made by injecting a thermoplastic material into a mold so as to mold the thermoplastic material onto the insert. This method of fabrication serves to: limit assembly operations; obtain a pendulum presenting an outside surface that is relatively smooth and favorable to performing laminar damping; and optimize the relative positioning of the center of inertia of the pendulum, the center of rotation of the pendulum, and the center of the cap. By way of example, the thermoplastic material may be polyether imide (PEI).

A damping liquid fills a portion of the housing 1 up to the top edge of the pendulum 3.

The throttling space 9 thus receives the damping liquid in such a manner that the damping liquid is throttled between the surface 8 and the wall 4. The annular set-back surface portion 10 co-operates with the wall 4 to define a kind of funnel encouraging the damping liquid to penetrate into the throttling space 9.

The radius of the pendulum 3 and the radius of the inside surface of the wall 4 of the housing 1 together define the thickness of the throttling space 9 and, by way of example, they are determined by relying on the theory of the Couette viscometer.

The damping liquid used is an oil having kinematic viscosity of 5 square millimeters per second ($mm^2/s$) at 25° C., specific gravity close to 0.91 at 25° C., and a freezing point of −65° C.

The thickness of the throttling space 9 is the result of a compromise taking account of the viscosity of the damping liquid and the selected fabrication method. Specifically, assuming that it is decided to perform fabrication by injecting thermoplastic material, the minimum thickness that can be obtained depends on whether or not any trimming is performed by machining.

The electromagnetic unit 2 has single-axis magnetometers 12, which are themselves known, comprising cores made of ferromagnetic material of high magnetic permeability that react with magnetic fields of low intensity. In this example, the ferromagnetic material used is more particularly an alloy of iron and nickel. In this example, each core comprises strips of said material, which are fixed in a glass tube.

Two superposing windings surrounding the glass tube, namely the primary winding and the secondary winding of the magnetometer.

The magnetometers 12 extend at 90° relative to each other and one above the other parallel to the first axis and to the second axis of the double hinge 6. The magnetometers 12 are spaced apart from each other to avoid magnetic coupling between them. The magnetometers 12 have their ends fastened in peripheral notches 15 of the pendulum 3 so that when the pendulum 3 is left free to swing and at rest, the magnetometers 12 are horizontal.

The housing has a connector 13. The connector 13 is mounted at the center of the plate 5. By way of example, the connector 13 is a connector of the sealed 8-pin cylindrical micro-connector type.

The windings of the magnetometers are connected to the connector 13 by wires.

These wires are twisted together to form a twisted cable 14 connecting the windings to the connector 13.

In its central portion, the twisted cable 14 forms a spiral that is given a generally conical shape, with its apex connected to the connector 13 so as to be the portion of the spiral that is closest to the pivot point of the pendulum 3, the base of the cone then remaining connected to the winding. The apex is thus the portion of the spiral that is closest to the connector 13. The twisted cable 14 thus defines a plurality of turns of ever increasing diameter on going away from the connector 13 in order to reach the windings.

The resulting conical spiral is shaped in such a manner that the conical spiral does not impede the movement of the pendulum. In particular, the conical spiral is arranged to extend substantially around the axis 7 (the height of the cone extending along said axis 7), the pendulum 3 being at rest and the plate 5 being horizontal, so as to minimize its influence on the swinging of the pendulum 3, to such an extent as to make it negligible compared with the effect of gravity.

Furthermore, the conical spiral is shaped in such a manner that the turns cannot catch one another, even when the pendulum 3 is swinging strongly.

The conical spiral shaped in this way presents a structure that is uniform when the pendulum 3 is at rest (i.e. the pitch of the spiral is regular, the increase in the diameter of the turns between two consecutive turns is regular, . . . ). In particular, the conical spiral does not present any change of angle along its length: a conical spiral is thus continuous. Furthermore, in this example, the spiral presents an integer number of turns.

In general manner, the twisted cable 14 is itself shaped in such a manner as to present a structure that is uniform. Thus, the number of twists in the twisted cable 14 is uniform over the entire length of the twisted cable 14 (it should be recalled that one twist corresponds to twisting the connected-together wires through 360°). Furthermore, the presently-described twisted cable has an integer number of twists.

A typical order of magnitude is an average of three to five twists per turn of the conical spiral, for four to six turns of the spiral.

As a result of the twisting, the twisted cable 14 presents cohesion between all of its wires such that the wires remain firmly pressed against one another without any wire projecting locally from the remainder of the twisted cable 14.

In order to align the traction force of the twisted cable on a radius of the swinging movement of the pendulum 3 so as to avoid inducing any torque on the pendulum 3 and more generally so as to avoid the traction force exerted on the pendulum 3 by the twisted cable 14 varying as a function of the angular position of the pendulum 3, the apex of the spiral is arranged substantially at the pivot point of the pendulum 3.

Furthermore, still for the purpose of increasing the mechanical strength of the connection of the wires to the connector 13, the twisted cable 14 does not form a right angle with the apex of the cone in order to be attached to the connector 13. Specifically, in this example, the apex of the cone extends as far as the connector and does so in a manner that is continuous with the remainder of the spiral. The beginning of the spiral thus extends obliquely relative to the axis 7 and not along the axis 7.

The twisted cable 14 has an end portion embedded in a block that is secured to the connector 13 and that also holds captive the zone where the wires are connected to the pins of the connector 13. By way of example, the block 16 is made of resin or indeed of adhesive.

The block 16 serves to increase the mechanical strength of the connection of the wires to the connector 13 and more generally to avoid any traction force exerted on the twisted cable 14 giving rise to large stresses on the wires individually or on their connection to the connector.

The block 16 is shaped in such a manner as to extend from the connector 13 to a level that is substantially at the point of intersection between the pivot axes of the pendulum 3, still for the purpose of increasing the mechanical strength of the connection of the wires to the connector 13 and of stabilizing and minimizing the forces that are induced by the spiral on the pendulum 3. Nevertheless, it should be observed that the apex of the cone is not necessarily embedded in the block 16. As a result, the free end portion of the twisted cable 14 (corresponding to the portion of the twisted cable 14 leaving the block 16) is arranged substantially at the pivot point of the pendulum 3.

The twisted cable 14 has its other end portion secured to the pendulum 3 by means of at least one drop of adhesive. In this example, the twisted cable 14 is secured to the magnetometer 12 of the pendulum 3, which is situated above the other magnetometer 12. In particular manner, the twisted cable forms an angle of about 90 degrees where it is attached to the upper magnetometer, substantially in a plane perpendicular to the axis 7, by means of the first spot of adhesive. The end portion of the spiral secured to the pendulum is thus tangential to a plane formed by a base of the pendulum 3 (which is thus perpendicular to the axis 7). The spiral thus presents geometrical continuity without any singular angle where it is attached to the pendulum 3, as for the remainder of the spiral.

Preferably, the twisted cable 14 is secured to the upper magnetometer 12 by means of two spots of adhesive so as to be certain of ensuring that the spiral is accurately regular. As from the second spot of adhesive, the wires diverge from the twisted cable 14 in order to go to the windings.

Apart from these two spots of adhesive and the adhesive that might be used for attaching the connector 13, the twisted cable 14 does not present any trace of adhesive along its surface, and in particular along its central portion that has the general shape of a conical spiral.

It should be observed that the central portion of the twisted cable 14 extends over substantially the entire length of the twisted cable 14, which is thus in the shape of a conical spiral with the exception of its first end connected to the connector 13 and of its second end connected to the upper magnetometer 12. The central portion of conical spiral shape thus extends substantially from the connector 13 to the upper magnetometer 12. Said central portion of the twisted cable 14 thus presents geometrical continuity without any singular angle over the entire length of the spiral, and in particular where it is attached to the pendulum 3 as at its attachment to the connector 13.

Some of the steps of fabricating the fluxgate need to be performed with care.

The magnetometers 12 need to be put into place with great accuracy, and this involves three steps:

positioning the plate 5 horizontally and allowing the pendulum 3 to swing until it occupies a stable position;

positioning the ends of the magnetometers 12 in the notches in the pendulum 3, while keeping both magnetometers in a horizontal position, and doing so without touching the pendulum 3; and placing a drop of adhesive (the adhesive used is very fluid) simultaneously in all four notches and causing the adhesive to polymerize.

This fabrication technique is particularly appropriate since it makes it possible to avoid adjustment members that would otherwise be necessary for positioning the magnetometers horizontally and for fastening them. Unfortunately, such adjustment members can degrade the laminar characteristics of the damping and they constitute massive elements that are offset relative to the center of gravity of the pendulum. In addition, eliminating adjustment members makes the fluxgate more accurate and more robust with an extremely limited risk of losing adjustment over time.

There follows a description of how to connect the windings to the connector 3.

In known manner, the wires in this example are obtained directly from the windings themselves and they are also secured to respective ones of the pins of the connector 3, e.g. by soldering.

Thereafter the wires are brought together towards the center of the connector and as close as possible to the pins. This makes it easier to form the twisted cable 14.

Obtaining good uniformity for the twisted cable 14 requires the wires to be identical in length. Thus, the paths followed towards the center of the connector 13 need to be taken into consideration in order to determine the necessary length of each wire prior to securing it to a pin.

Thereafter, the zone where the wires are connected to the pins of the connector 13 and the wires as collected together in this way are held captive in a first block of adhesive, resin, . . . , that thus also encompasses a portion of the connector 13.

Thereafter, the wires as brought together in this way are twisted and secured to one another at one end so as to form the twisted cable 14.

The beginning of the twisted cable 14 is then held captive in the general block 16, which in this example is molded onto the entire first block so as also to encompass a portion of the connector 13 and the zone where the wires are connected to the pins of the connector 13.

Thereafter, the twisted cable 14 is secured to the upper magnetometer by means of a spot of adhesive (corresponding in this example to the above-mentioned second spot of adhesive from which the wires separate from the twisted cable 14).

Figure 2:
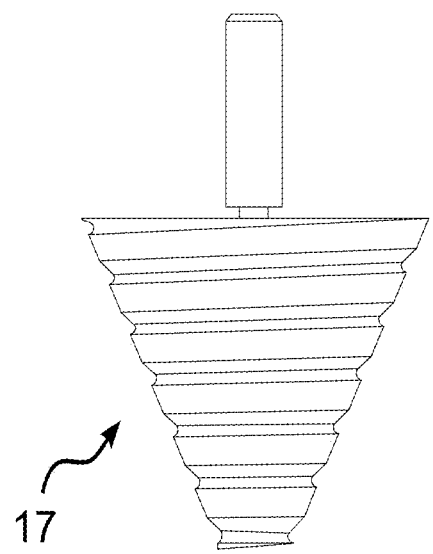
FIG. 2 is a perspective view of a tool for shaping a twisted cable of the pendulum system shown in FIG. 1.

It is then necessary to shape the twisted cable 14 into a conical spiral. For this purpose, a power screwdriver is used having a conical spiral tool 17 shaped to form the above-mentioned spiral (tool 17 shown in FIG. 2).

At the end of this step, the twisted cable 14 has the desired shape. Nevertheless, it needs to be secured in appropriate manner as described above to the upper magnetometer 12 and to the connector 13.

For this purpose, the base of the cone is initially secured to the upper magnetometer 12 using a spot of adhesive (corresponding to the first above-mentioned spot of adhesive) while ensuring that the spiral is shaped without any angle at this level.

Thereafter, the apex of the cone is secured to the connector 13, once more using a spot of adhesive so as to ensure that the apex does not form an angle with the remainder of the conical spiral.

Naturally, the invention is not limited to the embodiment described, but covers any variant coming within the ambit of the invention as defined by the claims.

In particular, the housing and the pendulum may be of a structure different from that described. The housing may have an outside shape that is different from its spherical cap inside shape.

The electromagnetic unit may have a structure that is different, and may include a torus.

Other damping liquids may be selected with values similar to those mentioned.

Although in this example the fluxgate works with laminar damping, the pendulum system of the invention could equally well be associated with a more conventional fluxgate operating with bulk damping. Damping is only optional, and the mode of damping may differ from the described fluid damping.

Furthermore, the order of the steps for connecting the wires between the connector at one end and the windings at the other could be different from that specified above.

The invention claimed is:

1. A magnetometer pendulum system comprising a pendulum connected to a connector, the magnetometer pendulum system including wires connecting the pendulum to the connector, which wires are connected together in a twisted cable, the twisted cable presenting a central portion which is in spiral, the spiral being generally shaped as a cone having an apex connected to the connector so as to be the portion of the spiral that is closest to a pivot point of the pendulum.

2. The pendulum system according to claim 1, wherein the spiral presents a structure that is uniform when the pendulum is at rest.

3. The pendulum system according to claim 1, wherein the spiral does not present any change of angle along its length.

4. The pendulum system according to claim 1, wherein the spiral presents an integer number of turns.

5. The pendulum system according to claim 1, wherein the twisted cable is shaped so as to present a structure that is uniform.

6. The pendulum system according to claim 5, wherein the number of twists of the twisted cable is uniform over the entire length of the twisted cable.

7. The pendulum system according to claim 5, wherein the twisted cable is shaped so that the number of twists in the twisted cable is an integer number.

8. The pendulum system according to claim 1, wherein the twisted cable has an end portion embedded in a block that is secured to the connector.

9. The pendulum system according to claim 1, comprising a block secured to the connector and holding captive a zone where the wires are connected to pins of the connector.

10. The pendulum system according to claim 1, wherein the twisted cable has an end portion secured to the pendulum in such a manner that the end of the spiral is substantially tangential to a plane formed by the base of the pendulum.

11. The pendulum system according to claim 10, wherein the twisted cable is secured to the pendulum at two points.

12. The method of fabricating the pendulum system according to claim 1, the method comprising the steps of:
   securing each of the wires for connecting the pendulum to the connector at one end to the connector so as to constitute a bundle of same-length wires;
   shaping the central portion of the bundle of wires into a twisted cable that is uniform over its entire length;
   securing the end of the twisted cable to the connector so as to ensure that there is no non-twisted free wire portion at that end;
   shaping the central portion of the twisted cable into a conical spiral; and
   securing the base of the spiral to the pendulum, and ensuring that the apex does not form a right angle with the remainder of the spiral.

* * * * *